United States Patent
Majlesi

(10) Patent No.: US 11,402,445 B2
(45) Date of Patent: Aug. 2, 2022

(54) ELECTRON INTRINSIC SPIN ANALYZER

(71) Applicant: Hosein Majlesi, Qom (IR)

(72) Inventor: Hosein Majlesi, Qom (IR)

( * ) Notice: Subject to any disclaimer, the term of this patent is extended or adjusted under 35 U.S.C. 154(b) by 0 days.

(21) Appl. No.: 15/273,334

(22) Filed: Sep. 22, 2016

(65) Prior Publication Data

US 2017/0115365 A1    Apr. 27, 2017

Related U.S. Application Data

(63) Continuation of application No. PCT/IB2016/054596, filed on Aug. 11, 2015.

(60) Provisional application No. 62/246,629, filed on Oct. 27, 2015.

(51) Int. Cl.
  *G01R 33/12* (2006.01)
  *G01R 33/60* (2006.01)

(52) U.S. Cl.
  CPC ......... *G01R 33/1284* (2013.01); *G01R 33/60* (2013.01)

(58) Field of Classification Search
  CPC .................. G01R 33/1284; G01R 33/60
  USPC .................................. 324/304, 4
  See application file for complete search history.

(56) References Cited

U.S. PATENT DOCUMENTS

| | | | |
|---|---|---|---|
| 6,639,218 B2 | 10/2003 | Mukasa | |
| 8,101,920 B2 | 1/2012 | Suzuki | |
| 8,552,398 B2 | 10/2013 | Karimi | |
| 2008/0217533 A1 | 9/2008 | Kohashi | |
| 2009/0045355 A1* | 2/2009 | Desbrandes | H01J 43/18 250/503.1 |

FOREIGN PATENT DOCUMENTS

| | | |
|---|---|---|
| CN | 104345331 A | 7/2013 |
| JP | 4700934 B2 | 7/2004 |

OTHER PUBLICATIONS

Massachusetts Institute of Technology Physics Department ("The Stern-Gerlach Experiment"; Pub Date Feb. 22, 2001; Earliest date in archive.org wayback machine Dec. 28, 2013; herein MITPD).*

(Continued)

*Primary Examiner* — Judy Nguyen
*Assistant Examiner* — Rahul Maini
(74) *Attorney, Agent, or Firm* — Hosein Majlesi

(57) ABSTRACT

An electron intrinsic spin analyzer measures the quantum states from a free-electron beam wherein the intrinsic-spin property of the electron's beam interacted with an inhomogeneous magnetic field. The generated beam from a hot tungsten wire paralleled after the initial deflecting and absorbing process by metal grids, and the paralleled beam travels without electrical or magnetic focusing through on a glass lamp. A graphite cover on both sides of the glass lamp and a gitter composed of cesium dioxide and barium absorbed other types of particles such as ions and atoms to do not hit the fluorescent plate. The free-electron beam interacted with independent assemblies of magnets on the moveable chassis, which produced from a homogeneous or inhomogeneous magnetic field and used for checking the rightness of the measured physics effects. The optically and electrically detections collected the data with a Langmuir probe and a charge-coupled device camera.

7 Claims, 18 Drawing Sheets

(56) References Cited

OTHER PUBLICATIONS

Karpa et al. ("Slow light in inhomogeneous and transverse fields"; Pub. Date 2008; New Journal of Physics; ISSN 1367-2630; herein Karpa).*
Porter et al. ("Direct demonstration of the transverse Stern-Gerlach effect"; Pub. Date Mar. 2003; American Journal of Physics 71; herein Porter).*
Sunandana ("Techniques and applications of electron spin resonance"; Pub. Date 1998; Bulletin of Materials Science).*
McGregor et al. ("Transverse Quantum Stern-Gerlach Magnets for Electrons"; Pub. Date 2011; New Journal of Physics; herein McGregor).*

* cited by examiner

Experimental results in setup I
by using dual flat magnets (homogeneous magnetic field).

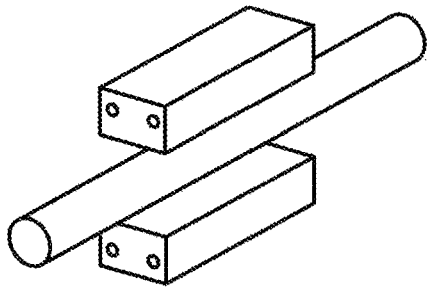

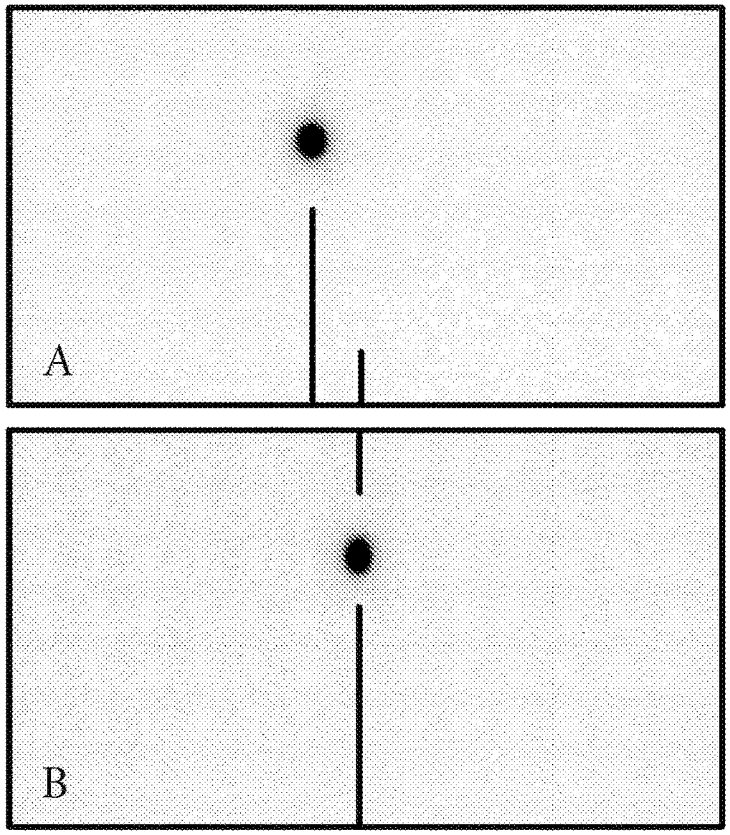

(A and B) Show: experimental results in setup I which done by using dual flat magnets (homogeneous magnetic field). (A) Shows the detected initial beam of free electrons without entering homogeneous magnetic field by dual flat magnets in setup I. (B) Shows the detected beam of free electrons after entering a homogeneous magnetic field by dual flat magnets in setup I. The analyzed optical data by image processing software appears that the initial electron beam just moves without any separation on the beam in setup I.

FIG.11

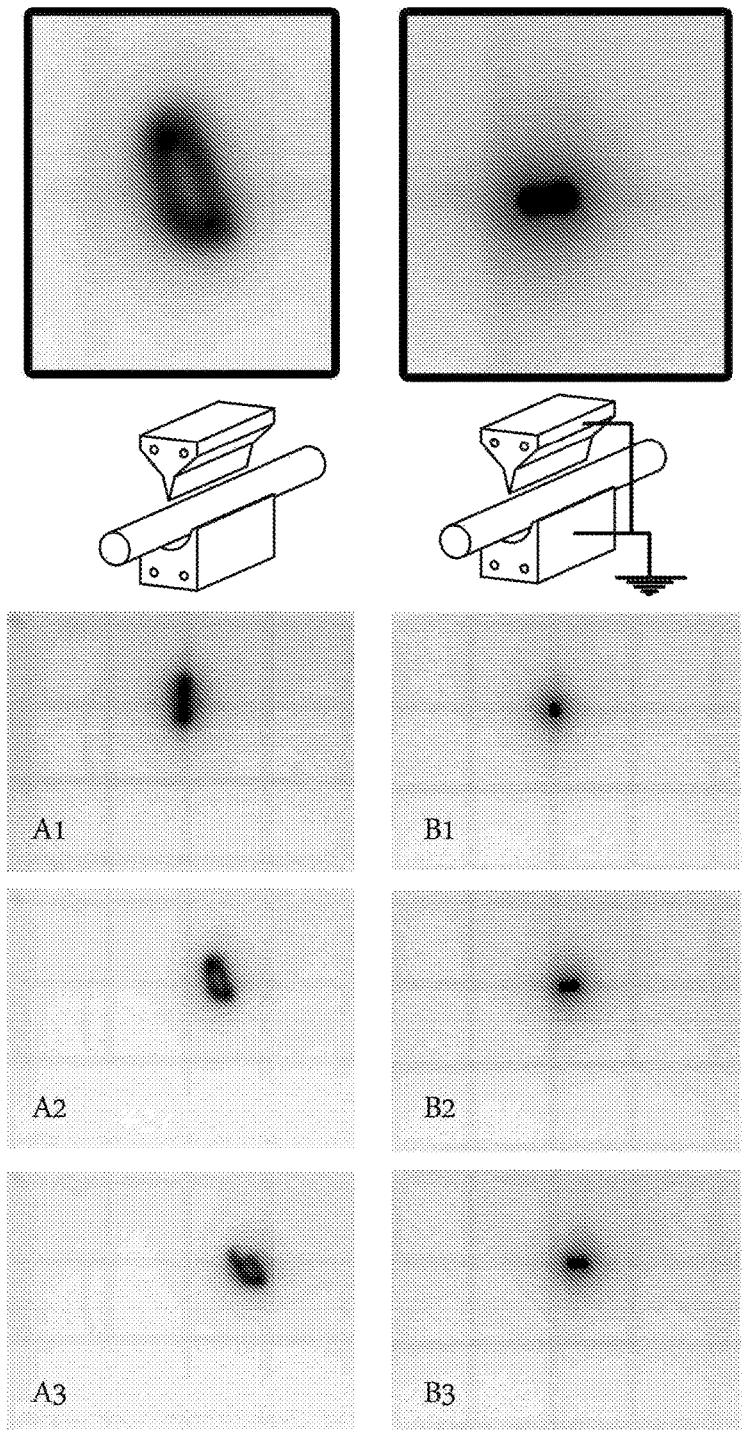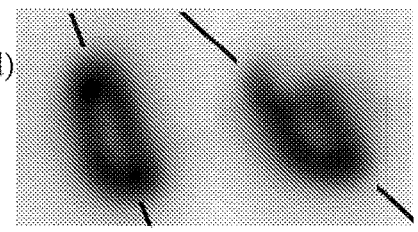
FIG.12

ELECTRON INTRINSIC SPIN ANALYZER

TECHNICAL FIELD OF THE INVENTION

This invention represents an apparatus for observing and measuring the intrinsic property of the free electron's spin. The intrinsic spin separation process of the free electron is useful in several independent fields such as quantum mechanics, quantum computing, quantum Cryptography, quantum Information, and quantum Communications, quantum memories, and quantum teleportation.

BACKGROUND OF THE INVENTION

In 1920, the concept and theory of "Spin" proposed for the first time by Samuel Goudsmit [1], George Uhlenbeck [2, 3, 4], and Wolfgang Pauli [5,6,7] they stated that an intrinsic angular momentum [8, 9] is an independent property of the orbital angular momentum [10, 11, 12] in each type of particle. This intrinsic momentum called a particle spin property. The "Spin" theory [13, 14] considered a fundamental property of each particle type (atomic [15] or subatomic particles [16, 17, 18]). While the free electrons interacted with an inhomogeneous magnetic field, a force exerted from the magnetic field.

$$F = -\nabla U = -\nabla(\mu.B); \mu = 0.927 \times 10^{-23} [amp.\ m^2]$$

According to this note that the mass and the radius of free electrons are very too low:

$$m_e = 9.11 \times 10^{-31} [kg] \text{ and } r_e = 2.8179 \times 10^{-15} [m]$$

If the classical physics calculation about the separation of free electrons considered:

$$z = \frac{1}{2}at^2 + vt = \frac{1}{2}\left\{\left(\frac{\mu}{m_e}\right) \cdot (\nabla \cdot B)\right\} + vt$$

The calculation shows this experiment could not be observed in action because the mass of free electrons is extremely too lower than the velocity properties and was a challenge on the physics calculations. These points on classical physics stated some main challenges in fundamental of physics. On the physics theory [19], the quantum states (the spin of free electrons on the free space) under the separation of the phenomenon should answer the specific standards and must isolate in the vacuum space without any potential limitations on the several types of particles in this experiment. In the experimental mechanism, the particle beams should not be affected by other types of particles such as more massive particles, and free electric charges (positrons), neutral atoms, ionic charges, or unexpected other factors.

For the first time, Otto Stern and Walter Gerlach proposed [20, 21] and experimented with utilizing a beam of silver atoms to represent the rightness of spin theory in the principal concept. However, they could not test or find a technical solution to overcome the problem and lead to the spin separation by free electrons on the free space directly at that time. They used the silver atoms [22] which characterized by symmetrical angular momentum. Therefore, they could argue that in the case of the experiment by silver atoms, the accuracy of the spin theory on quantum could be realized and proved the theory in action. As they stated, the spin of heavier atoms could be separated better and easier than the smaller particles such as the free electrons.

Niels Bohr [23, 24], Wolfgang Pauli [25, 26], and Nevill Francis Mott [27, 28] have believed that given the Bohr Magneton coefficient compared to the gradient of the magnetic field range, this phenomenon (intrinsic spin property) for free electrons in free space may not be observed in reality. They presented that the observation of intrinsic property of free electron's spin is impossible, and this impossibility is a general principle on physics, so they believed that this experiment never could express in terms of classical physics. So, they stated that [29]:

"It is impossible to observe the electron spin, separated fully from its orbital momentum, by using experiments based on the concept of classical particle trajectories".

According to the historical communications between the physicists and Wolfgang Pauli, he fanatically believed that separating the intrinsic spin property of free electrons never possible to be separated or observed in action. Although the Niels Bohr maintained and merely said [30]:

"I have sometimes thought of the problem with the electron polarization realization, and after all, I am quite prepared as such a polarization might be observable. The argument tells . . . not that the closer quantum-theoretical treatment will never give a positive effect".

Their theories continued by other scientists that represented different and independent ideas [31-34] about this physics phenomenon by many studies that raised in this case.

Some previous researches and theories reached by several physical simulations [35] about the electron spin separation. However, they predicted that the electron spin separation phenomena maybe observe in action in the further [36, 34]. According to some reasons in the theory of classical physics, none of them could set up any experiment by free electrons in action. The electrons constrained by a nucleus of an atom or energy levels in semiconductors in all earlier experiments until the present invention.

An idea of the present invention is making a higher magnetic field gradient that inspired by a performed mathematical calculation [37] which come up with "a" final relationship that represents the role of the radius in a sharp-curved magnet in making the gradient (FIG. 16, 17).

$$\left|\frac{\partial H}{\partial z}\right| = \delta \frac{H}{a}; \ (\delta \approx 0.9)$$

Based on the above equation, the idea shows how to make a higher magnetic field gradient inspired by the mathematical calculations. It is necessary to produce an inhomogeneous magnet by sharp-curved magnets (FIG. 5, 17).

Although, the spin separation phenomenon could observe at the higher range of a magnetic field gradient in the present invention. The requirement range of the magnetic field gradient could be reduced and balanced by other main parameters to lead the spin separation. The experimental result shows that this phenomenon observed for the first time by using this invention in action. This result may use in the quantum theory, as well as in many different fields of physics.

According to the plasma issue and Langmuir probe [38, 39] subject in the plasma, the detected result of the experiment shows how the order of free electron's velocity [40-43] on the theory and action is in the near range.

They are some old patented systems and devices such as:
For example, the patent number US20090107895 A1;

The structure of the pointed patent application is a classical Stern-Gerlach model that separates free particles on the atomic scale. As the evidence shows, it is easy and possible to produce all types of particles in atomic scales. However, the pointed patent has no particular methods to isolate non-atomic particles. This cited invention did not mention how it produces the free-electron beams, but it just referred to a general word "Particle". The primary aim of the classical Stern-Gerlach experiment is to prove the spin theory, but for the electrons, the problem is too hard. As historical points that reminded in this invention, some issues and challenges were unsolved by him.

For example, U.S. Pat. No. 6,403,999 B1:

The referred patent is a type of non-particle spin system that serves as a great idea to separate free electrons bounded by the potential of semiconductor materials. In semiconductor materials, atoms have more free electrons in their high levels of energy bands and share them with adjacent atoms. They just transported the electrons in semiconductor materials and among the atoms. Although the electrons can move in semiconductors much faster than the free space, they bounded by the potential energy. Thus, this cited patent is different from the present invention.

DETAILED DESCRIPTION OF THE INVENTION

The glass lamp vacuumed by the particular and technical methods in the present invention. The produced electron beam from a hot tungsten wire on the electrical element passes through a parallel supplier (a metal grid in the electron GUN) to the fluorescent lamp plate by the difference in electrical potential of metal grids (without any electrical focus that regularly utilized with a second voltage). Based on the principles and the concepts from the theory of spin in the quantum, When the spin states in the free electron beams passes through the inhomogeneous magnetic fields and become separated (FIG. 12).

The electron separation could be observed and measured by using the calibrated plate on the front side of a fluorescent plate regarding a glass lamp (FIG. 9). The source of the free electrons in the present invention has a different mechanism rather than the classical mechanism of the Stern-Gerlach experiment by silver atoms. After the main spin separating of the free electrons in the present invention, the beams could change to linear form for better observation. The paralleling and separating processes of the emitted particles (electron) done by using an electron gun comprising the electrical elements which consist of several types of metal grids).

Unlike the classical Stern-Gerlach experiment, the linearization process in the present invention may just entered after the main spin separating processes on the beam, because it only would appear better detection. So, This Linearization process in the present invention may do not consider merely scientific concepts and aims of the spin separation theory. (Number 20 on FIG. 1).

According to the Lorentz force effect and the right-hand law, by entering dual flat magnets and generate a homogeneous magnetic field gradient on the free-electrons beams, the initial single-beam just moves without any spin separation in the electron beam (FIG. 11). In the present invention, the electron beam just separate into two beams by using a sharp-curved magnets that generate an inhomogeneous magnetic field (FIG. 12). (Both of utilized magnet types are stationary over time).

It should note, the spin separation phenomena would observe in the direction of the shooting beam that interacted with the magnets, and the separated beam moves in a diagonal direction by rotating. Based on the several physical including engineering reasons, both of the spin separation force and the Lorentz force are observable and measurable on the detection process of the present invention in one time (FIG. 12).

It noted that as many reasons such as the plasma parameters, the velocity of the electron considerably reduced. In this turn, it leads to the objective observation of the phenomenon could be observed objectively through by lower voltage and current in the apparatus.

According to the using range of voltage in the anode and cathode, the distance of spin separation could produce a better observation in the results of the experiment. If the body of magnets unconnected to the ground, the observational results would be observed similar to the classical Stern-Gerlach experiment by silver atoms (FIG. 12). Therefore, the observational results of separated beams appear similar to a human eye and it moves with rotating in a plate when the range of the magnetic field converts to large orders (FIG. 12). The side movement of the beam merely could be explained with the Lorentz force effect. But, the separating and rotating of the beams merely could be explained by the spin separation force effect in the observational results in the present invention. In this case, if in any way, the electron beam could not be deionized from more massive and other types of particles like negative ions, it causes the observed results lead to unwanted results.

Therefore, the unwanted results have consisted of several effects from other types of particles that may reach in the results. According to the using range of voltage on the anode and cathode in the present invention (FIG. 6, 7), the spin separation distance could produce more significant observation in the results of the experiment. Because in the first deflection of the present invention, more massive and subatomic particles separate during the experiment (without electrical focusing). Therefore, in the results, positrons or positive ions will be removed in an elongated glass lamp with other metal grids and a graphite cover that shielded in the internal and outside body of the glass lamp (FIG. 6, 7).

Other impacts, such as the neutral free atoms used in the electron gun remove by utilizing the secondary vacuuming techniques. (it entered by metal grid 111, which called Gitter in the present invention FIG. 6, 7).

All plates (grids) on the electrical parts have direct current and DC voltages similar to cathode voltage in the glass lamp (FIG. 7). Their differences are in the shape, form, and spacing. And the other factors which deflect the particles from the first shooted path of the beam, but the free electrons return to the main direction toward to the fluorescent plate.

Compared to the monitoring systems, this invention characterized by different processes to make the beam.

In the present invention, the stationary magnet or coils with a constant electric current used to generate a suitable magnetic field gradient.

BRIEF DESCRIPTION OF THE DRAWINGS

FIG. 11: Result of experiment in setup I.

FIG. 12: Result of experiment in setup II.

DESCRIPTION OF EMBODIMENTS

Figure 1:
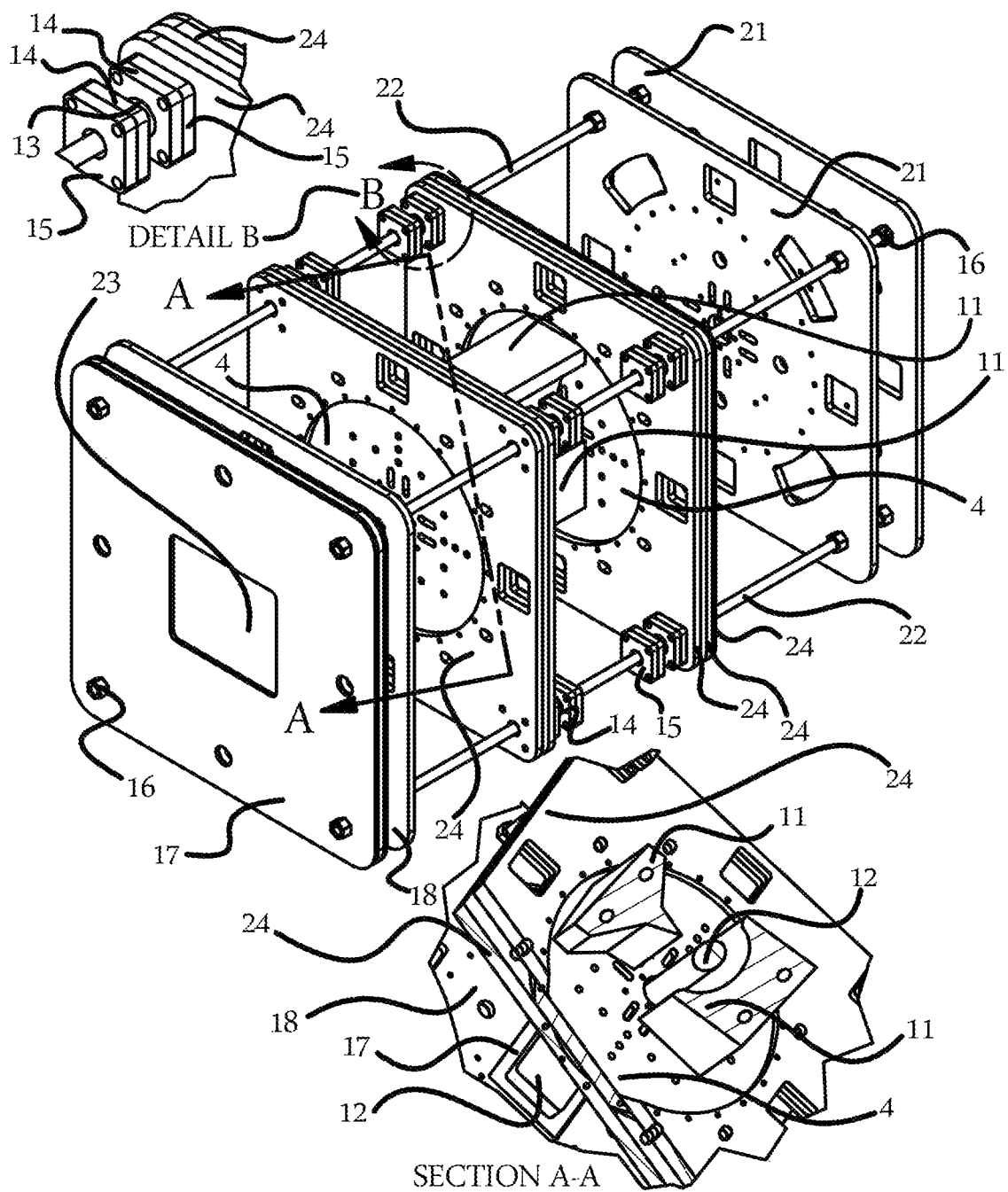
FIG. 1: Side and perspective view of the invention.

In order to meet the criteria, the present invention used a structure that explained in follow. To assemble different parts of the device, some plates assembled on different chassis, wherein several axes 22 hold all of the parts together (FIG. 1, 8,, 10, 14, 15).

Figure 10:
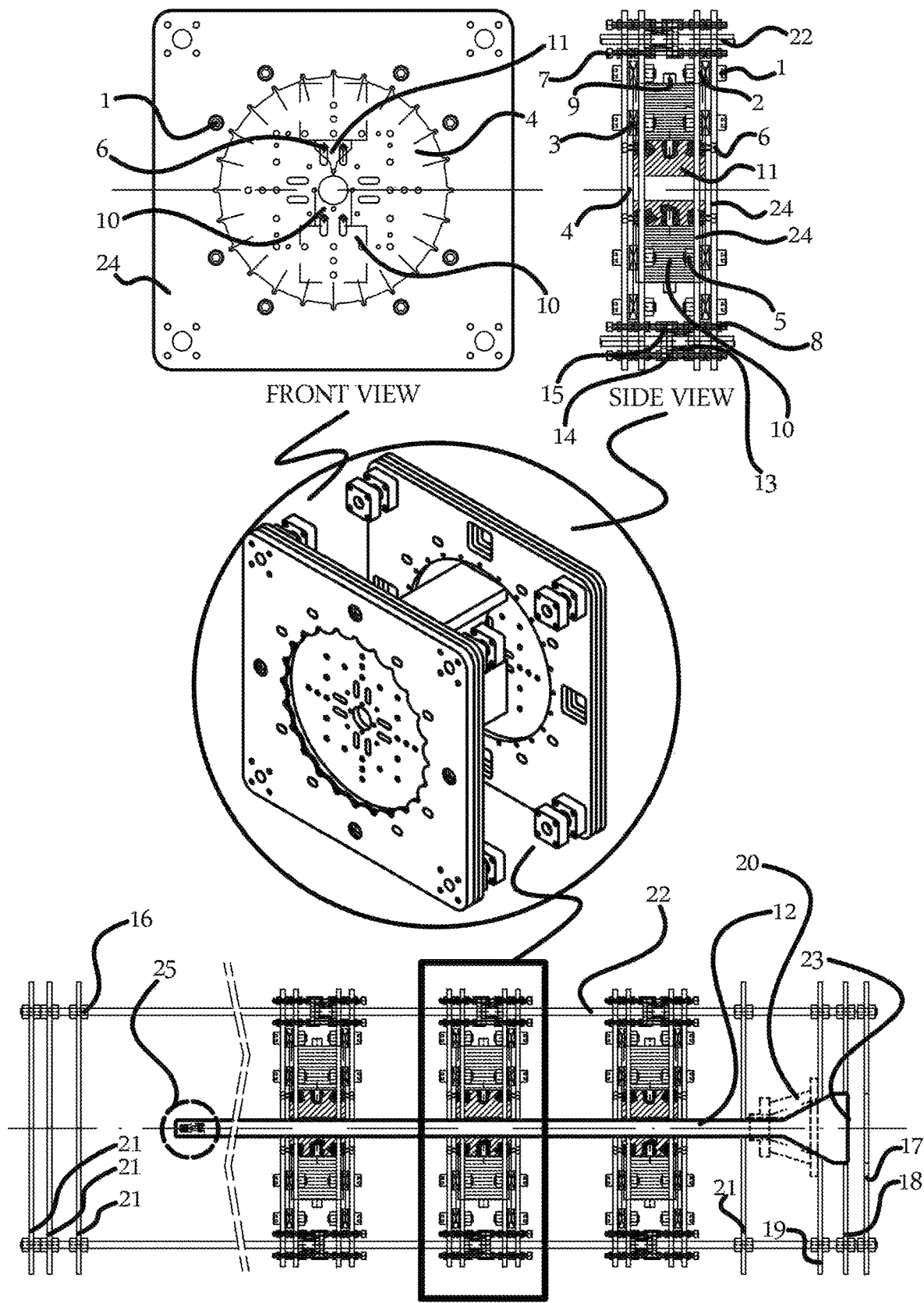
FIG. 10: Moveable chassis.
Figure 14:
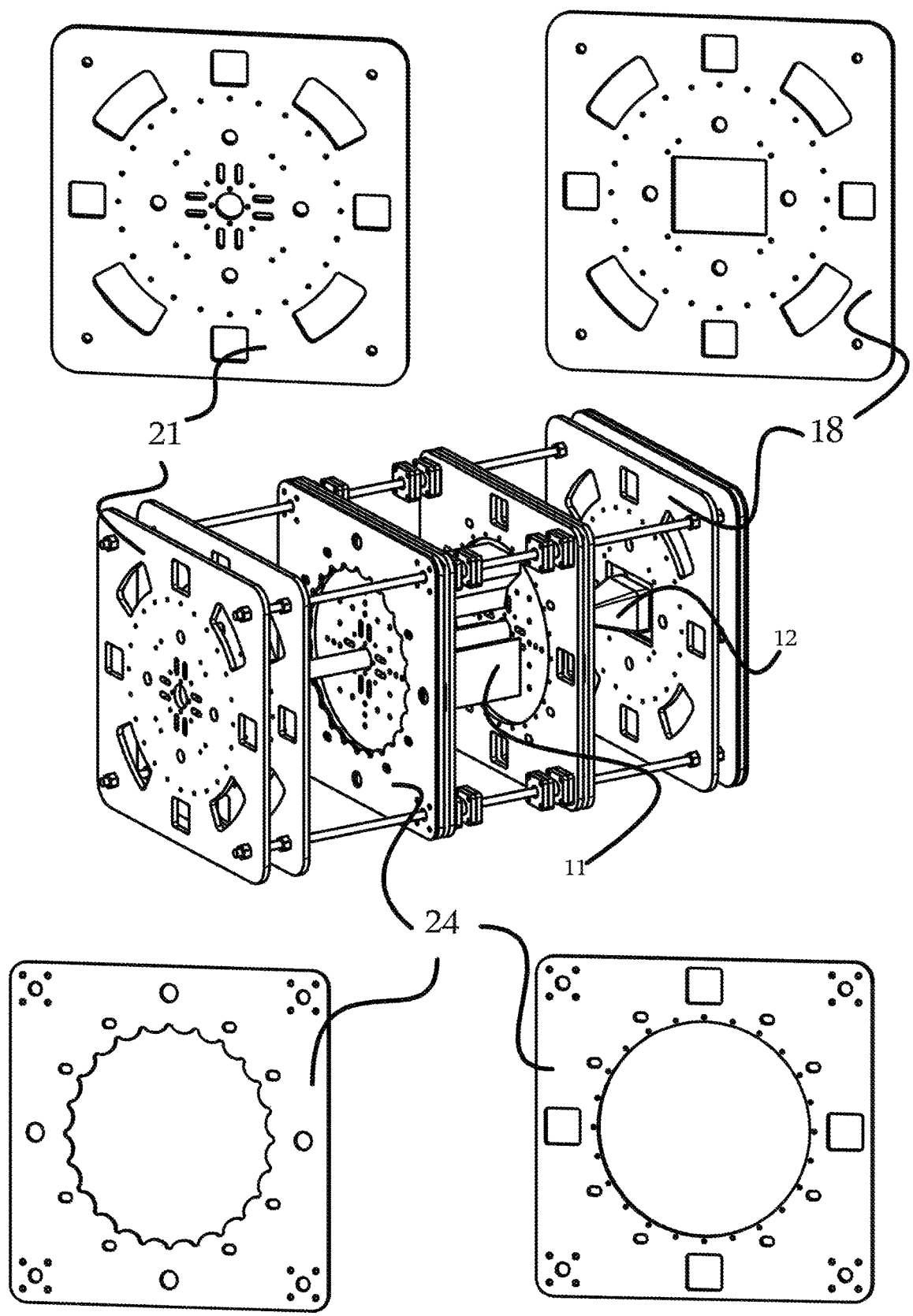
FIG. 14: Holder plates on a fixed chassis.

Several linear bearings used to move the moveable chassis on the shafts (FIG. 10). Also, it has several holder plates such as the fixer holder plate 21, and it has some holes to hold the metal parts by the magnetic field conductor (FIG. 14).

The moveable part of the chassis in the present invention called "S.G block", "S.G box" or "Stern-Gerlach block" (FIG. 10).

There are some holes on the holder plate to help the transportation or installment of the metal parts of the magnetic field transmitter. If one part does not intend to rotate and change the moveable chassis location, it could be used instead of the moveable chassis (FIG. 1, 2, 3, 8, 10, 14, 15).

Each moveable chassis includes two pairs of magnetic field generators that used by users in the electron intrinsic spin analyzer (FIG. 10).

Figure 4:
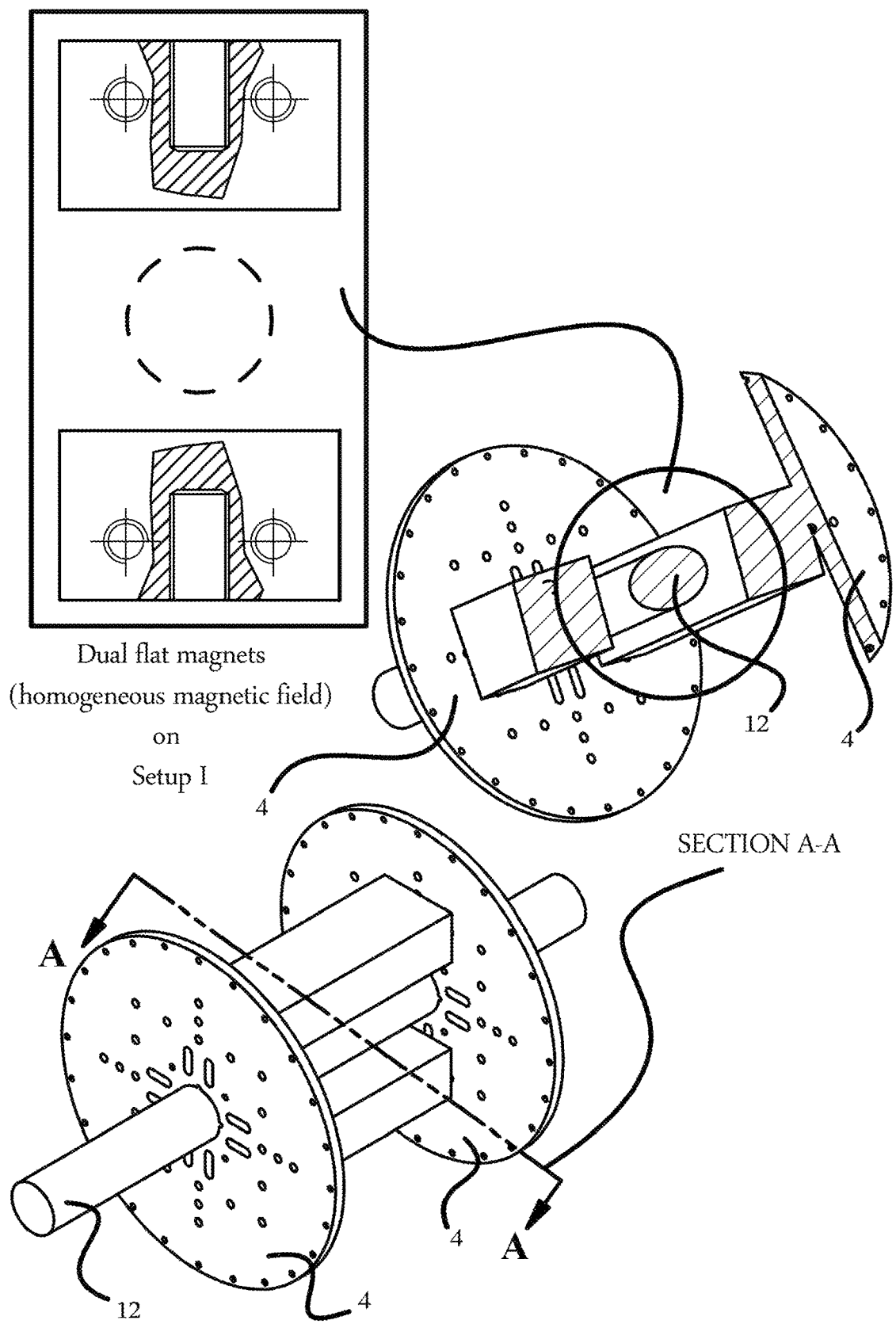
FIG. 4: Cross section of dual flat magnets that utilized in setup I.
Figure 5:
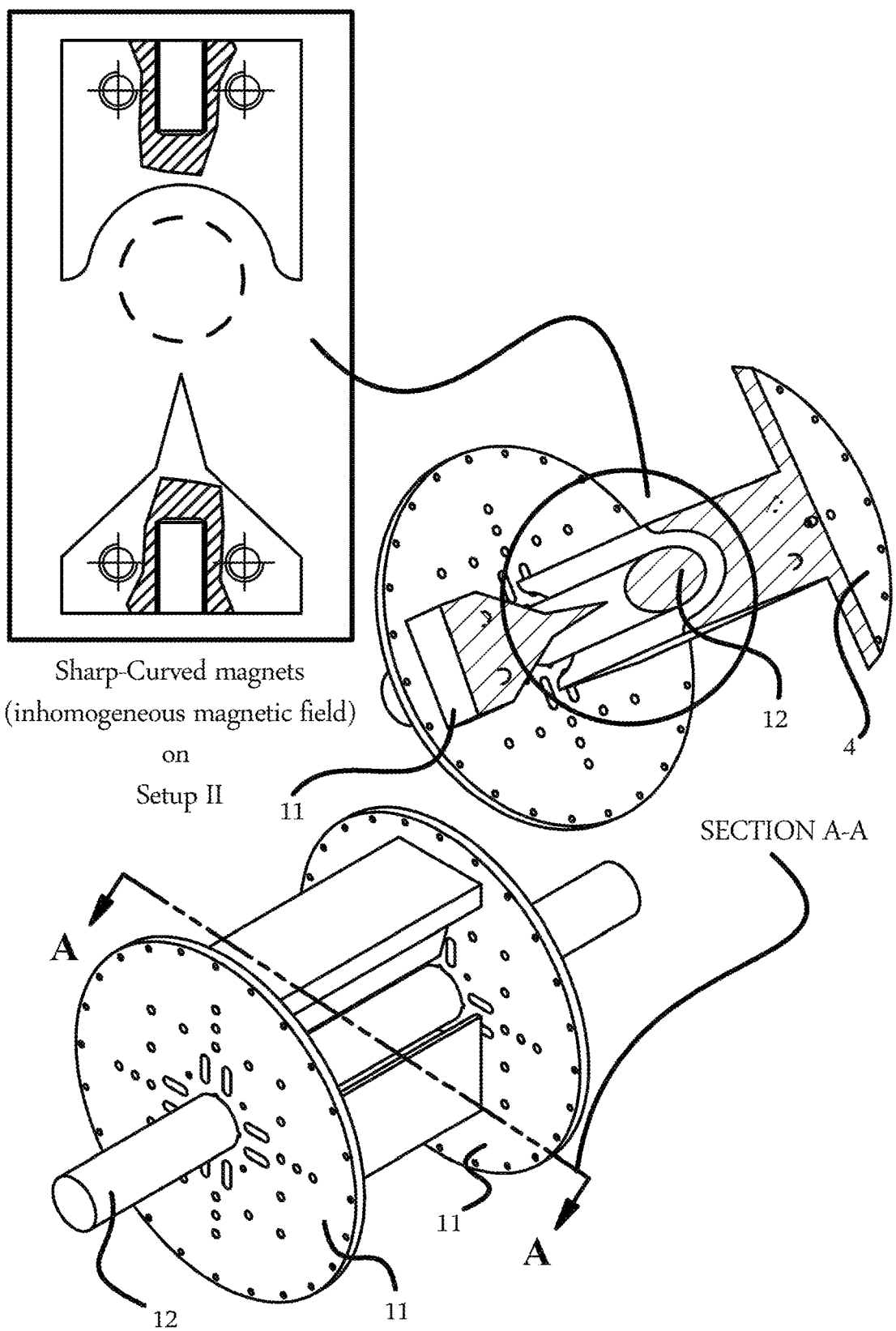
FIG. 5: Cross section of sharp-curved magnets that utilized in setup II.

To determine the Lorentz force effects on the beam, dual flat magnets in the moveable chassis entered on the free-electron beams (FIG. 4). Based on the fundamental concepts on the theory of quantum mechanics, an inhomogeneous magnetic field must be generated by both non-uniform magnets in the moveable chassis to study the free electron spin separation phenomenon (FIG. 5).

The magnets which produced the magnetic fields are located outside of the elongated glass lamp tubes and mounted on a chassis by utilizing stationary magnets that are replaceable by coils. The support frame for parts of magnetic fields allows rotation in different angles and movement on chassis (FIG. 1, 3, 5).

Figure 2:
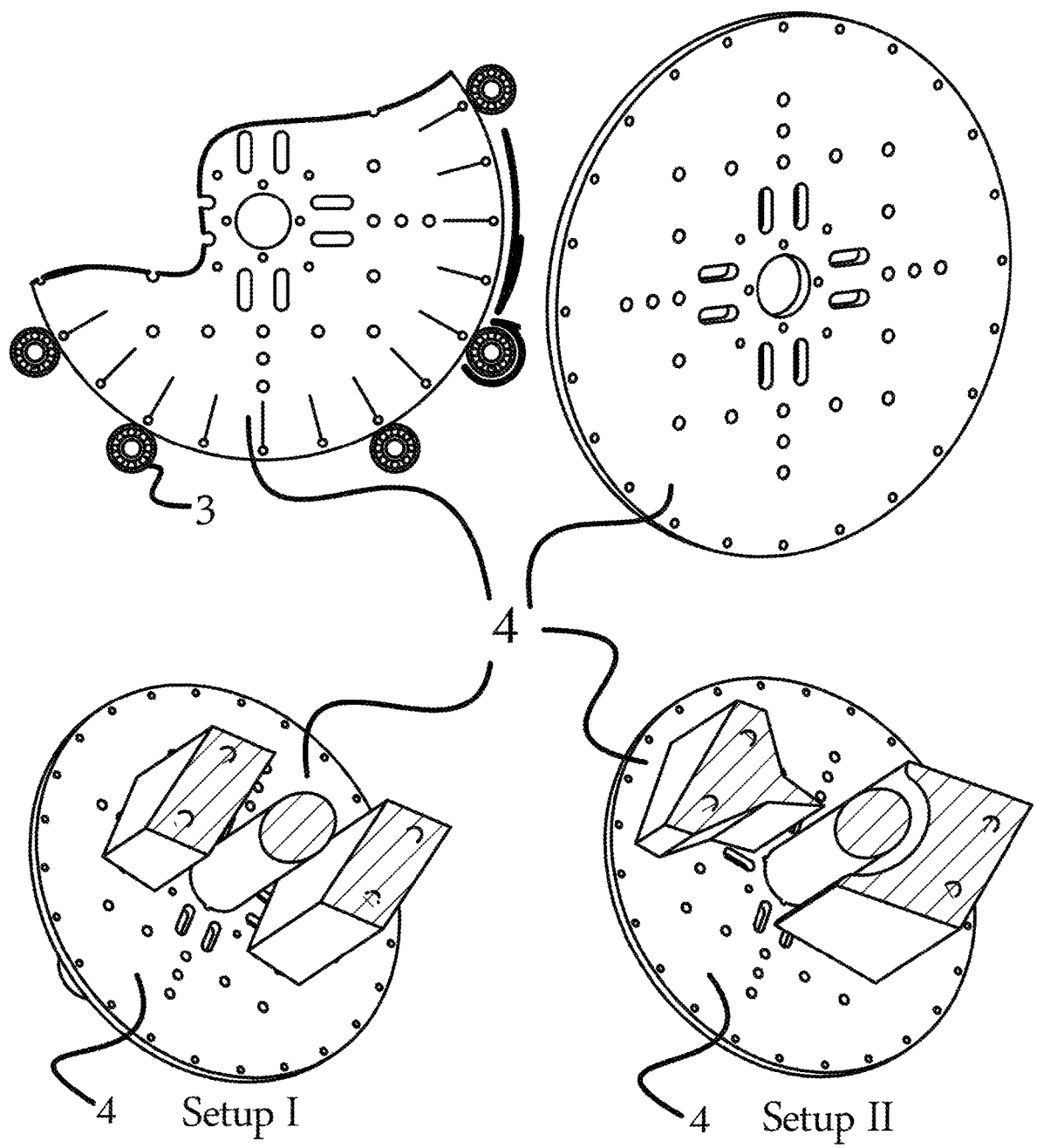
FIG. 2: Circular plate structure in setup I and setupII.

The magnets could rotate and lock at specific angles (FIG. 2, 3).

The main chassis has moveable chassis that could extend in the apparatus. Upon adding the additional moveable chassis, the sequence Stern-Gerlach phenomenon could test on the experiment (FIG. 10).

Some of the screws in the moveable chassis used to hold the holder plates 1 and 24. Also, some of the washers 2 used to hold the bearings 3 and the circular plate 4, and the magnetic field conductor's pieces, wherein the bearing 3 allows the plate to rotate on the chassis.

Some holes in holder plates located in the center area and the intervals holes connected some sockets and other elements (FIG. 14, 15). At the same time, some slits designed to hold the magnetic field conductors and set the distance between the magnets. On lateral parts of the calibrated plate, some measuring lines could be glow, which is calibrated and measurable with accurate angles. Some holes used to fix the plates 24 at the end of measuring lines. Some of the bearings 3 restrict the direction of rotation and change position 4, by a circular hole which located in the center of the circular plate. The glass tube lamp passes through central holes based on the geometric and computational circles. FIG. 2, 3, 15 represent the described structure.

Figure 3:
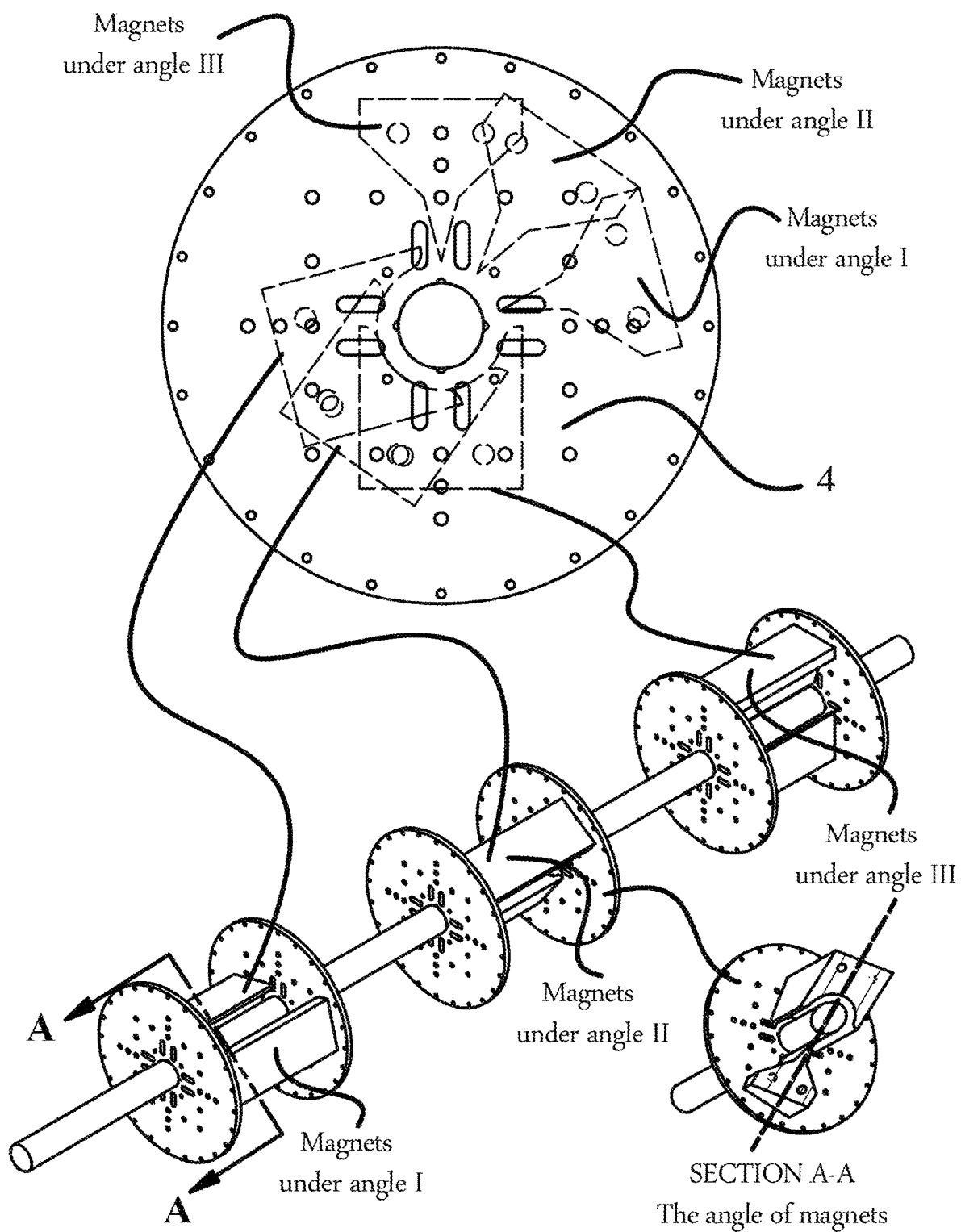
FIG. 3: Circular plate when it holds and rotate the sharp-curved magnets in different angles.

FIG. 3 represents attaching and rotating in the assemblies' methods of the magnet's connection to the plate 4.

Some beads 5 used to hold the plate. A bolt used to fix a circular, scaled, and rotating plate. Supporting bolts 7 is the connection plates in the moveable chassis. Some beads 8 used to hold the moveable part of the chassis. Coils 10 fixed by the holder's bolts 9. The coils used an electric current and replaceable by permanent magnets (FIG. 1, 10).

Magnetic fields metal parts (11): Some parts of the metal plates used in separate setups to generate the requirement of magnetic fields in the different assemblies.

A permanent magnet may replaced to all the magnetic coils that applied by a stable electric current. To generate a homogeneous magnetic field gradient, two flat pieces used on setup I. Also, the other paired parts used in setup II to generate the inhomogeneous magnetic field. (both of magnets are constant over time).

Setup I

Two flat metal pieces used in this setup to study and observe the Lorentz force effect on the free-electron beams, and these pieces reached the requirement of magnetism by a stable current, and DC voltage based coils or permanent magnets to assess homogeneous magnetic fields in the Lorentz force experiment by free electron beams. These parts connected to plate 4 with the adjustable distance between the pieces, and they placed in the minimum computational and geometric circular distance. (FIG. 4, 11).

Setup II

In this setup, based on the fundamental concepts on the theory of quantum mechanics, A pair of metal pieces used by utilizing a sharp edge (FIG. 5) to transfer the magnetic field and generate the inhomogeneous magnetic field gradient, and the second metal pair has a curved form. Based on geometric and computational circles, the form of magnets designed to diffuse the magnetic field density lines (FIG. 17).

Figure 17:
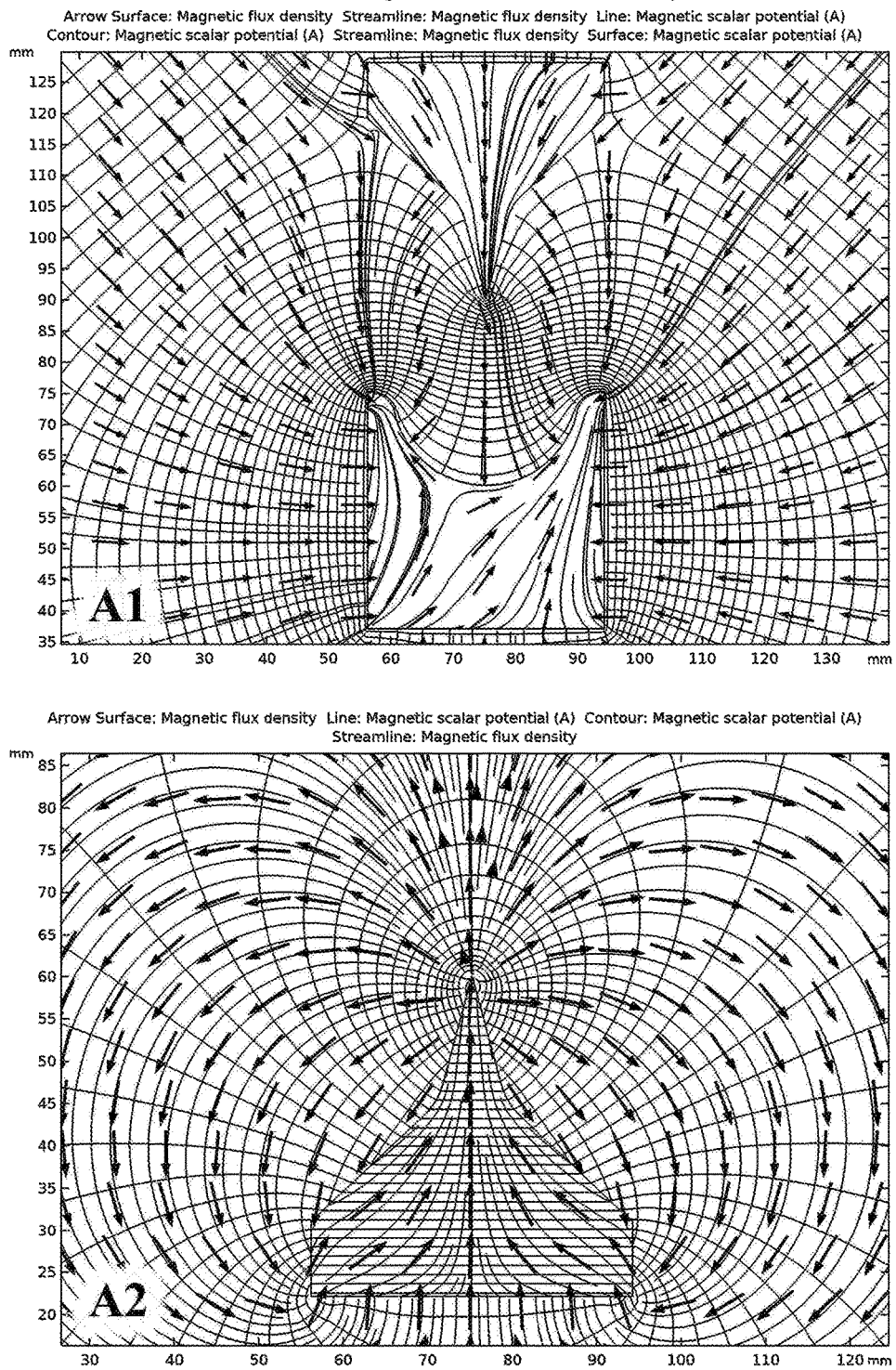
FIG. 17: Simulation of sharp-curved magnets in setup II (Magnetic Flux Density).
Figure 18:
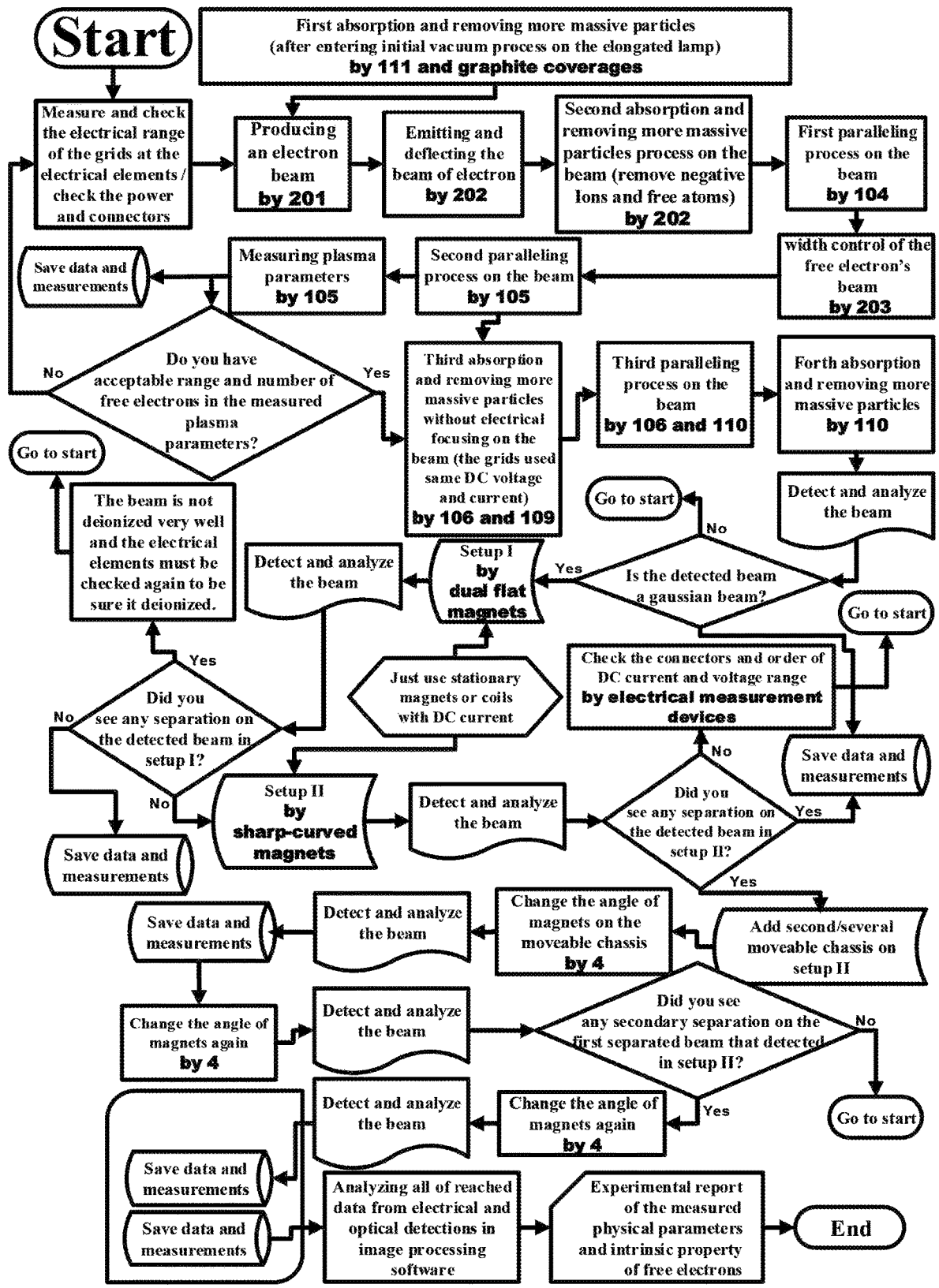
FIG. 18: A general diagram of the present invention which presented in the description of embodiments and utilized in setup I and setup II.

Magnets organized by geometric formulations, to be utilized better in the simulation (FIG. 17).

Lamp (Number 12) for this apparatus held by several plates and it included the following parts: The electron gun, Glass and body of elongated lamp, Phosphorescence plate (FIG. 1, 9).

A: Electron Gun

Figure 6:
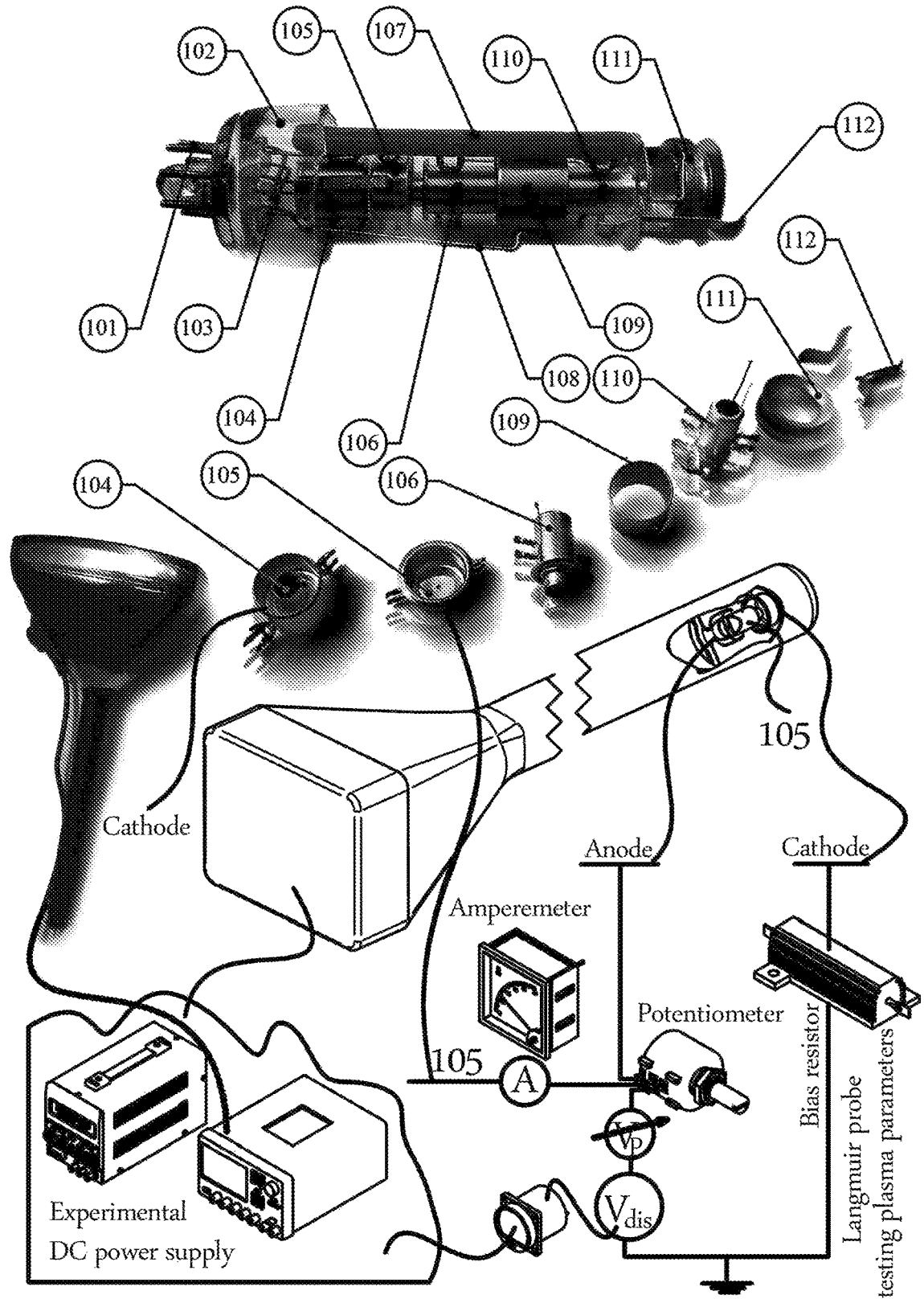
FIG. 6: The electrical elements on the elongated glass lamp and the role of each of them in plasma measurements.
Figure 7:
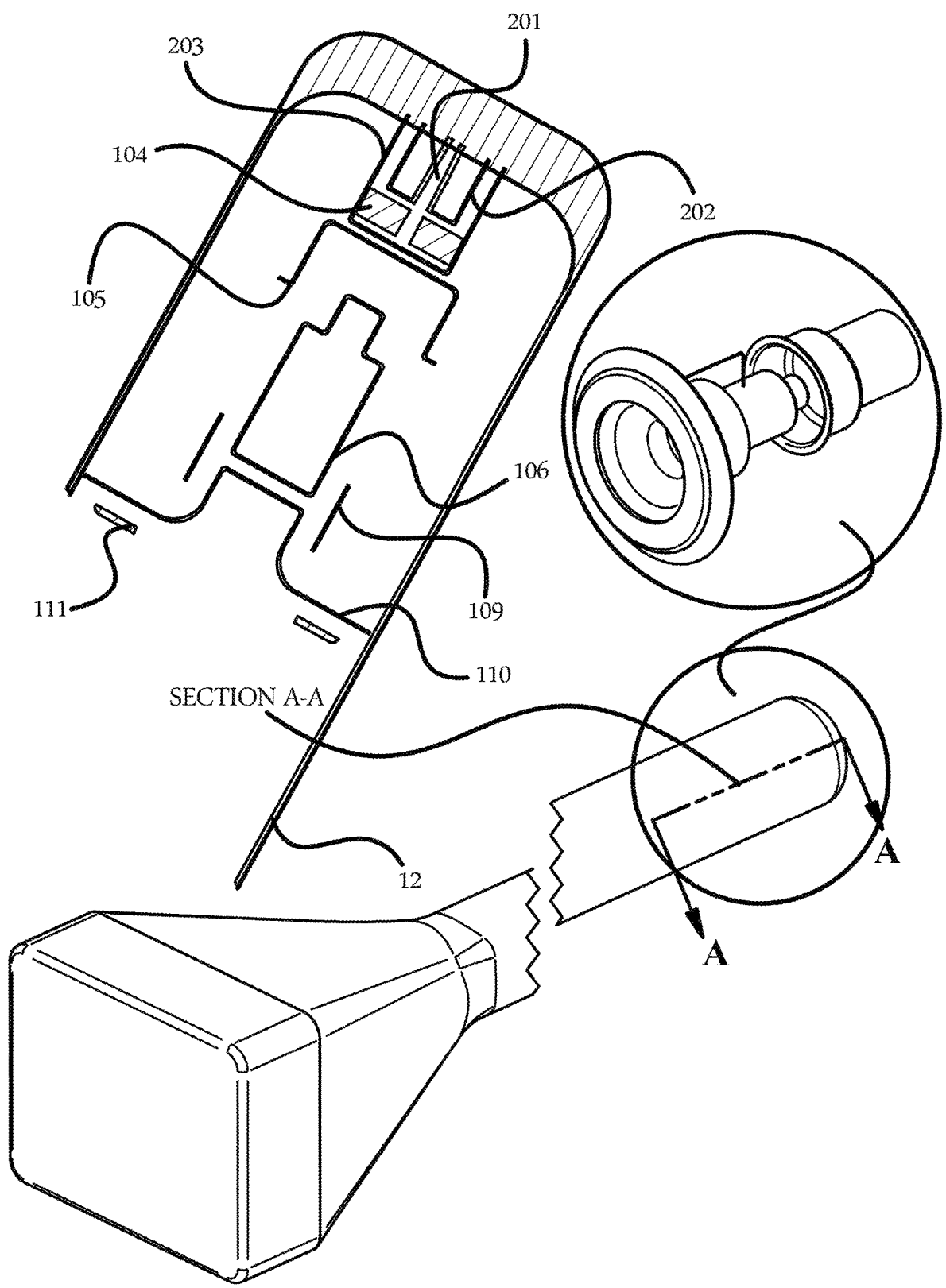
FIG. 7: Cross section of the electrical elements on the elongated glass lamp.

FIGS. 6 and 7 show the electrical elements on the of the glass lamp 25 (electron gun) and indicates the distance between the end edges of the gun component to the fluorescent plate. The metal grids of the electron gun 106, 109 used the same voltage range.

The glass lamp consists of four preserving containers 104 that established at an angle 10 to 30. Also, the grid plate 6 characterized by a different voltage. In this process, the electric current is a constant range (FIG. 6, 7).

Gitter 111 is consists of cesium dioxide and barium compounds (FIG. 6). This piece applied in the deionization process generally, and it removes the remain free atoms of the diffusion in the vacuum. It causes the vacuum within the tube to become a much higher level. The utilized range of DC voltage in the electron gun is from 2.5 to 12.5 Volts, which used in the grid plate 104, 110 (FIG. 7).

In this process, the electrical current is constant. The fluorescent plate has not metal grid plate, and the free electrons directly shoot to the fluorescent plate. Inside (i.e., outside the mainstream for electron moves) and outside the glass lamp covered with graphite cover, shielding.

Grid plate 201 is a tungsten wire that heated by DC-based on the theoretical fundamentals of the experiment by utilizing several processes on a beam of free electrons to remove fluctuations (from the DC voltage and current of the tungsten wire).

Cathode 202 is located in the form of two nested cylinders and acts as a tungsten holder. Unlike usual monitoring systems for deflecting the negative ions and electrons, the internal holders slightly diverted the preserving container 4 in this lamp installed diagonally along the lamp direction (FIG. 1). The heavier ions in the earliest stage pass through a different way from the original one hit the walls and absorbed (FIG. 7). The electron beams could return to the main path after the deflection.

Standard monitoring systems (CRT) usually have a metal plate by matrix holes in the back of the glass plate on those systems typically to remove negative ions before the free-electron beams could receive to the glass plate, but the present invention does not apply that stated plate (FIG. 6).

The grid plate 105: This part characterized by a micrometer hole used in the paralleling process of emitted particles (FIG. 7).

The grid plates 106, 109, and 110: These three parts do not have any electrical focus system in the present invention. However, it regularly used in the usual monitoring systems. Because the grid plates 106 and 110 joined together, and other grid plates have a partial potential difference between the grid plates. These plates used a partial difference between the potential of metal grids to the deflected beam separate more massive ions from the shooted particle beam. Also, the deflected beam from the cathode to anode returns toward the main path by existing electrical fields (FIG. 6, 7).

For accelerating and shooting processes, the present invention has two electrode parts:
1) Cathode
2) Anode.

There is functionally a little variety in the voltage ranges between the metal grids, and used for deflecting and absorbing and paralleling processes of the beam. The difference between the potential of the metal grids is extremely closed to the electrons have equal velocity.

The plates 106 and 110 allow the free moving electrons to have the same acceleration (FIG. 6, 7).

Collimator 203 serves as a ceramic part and acts as a separator for collimating (paralleling) and be the cathode. It is electrically isolated (FIG. 6, 7).

The cylindrical metal grid has a micrometer hole in the bottom, which the electrical charges and particles emitted and paralleled 204 from that micrometric slit (FIG. 7).

B: Glass Lamp and Body

The fundamental structure and body of the glass lamp on the present invention are different from the standard monitoring systems. A thin layer of the graphite covered inside and outside the glass lamp, and it connected to the earth to avoid the electrical charges accumulation in the body of the glass lamp.

The standard monitoring systems such as a CRT (Cathode Ray Tube) monitoring systems, do not need to test several physics concepts with more accurately or the glass tube of the glass lamp in the present invention is taller than the usual monitoring systems.

C: Fluorescence Plate

A metal plate in the back of the plate in the usual monitoring systems used to control the beam but it unused in the present invention. So, the glass plate can glow homogeneously the fluorescent plate without any metal grid in the back of the plate, because more massive particles than the electrons may hit the fluorescent plate easily.

Figure 8:
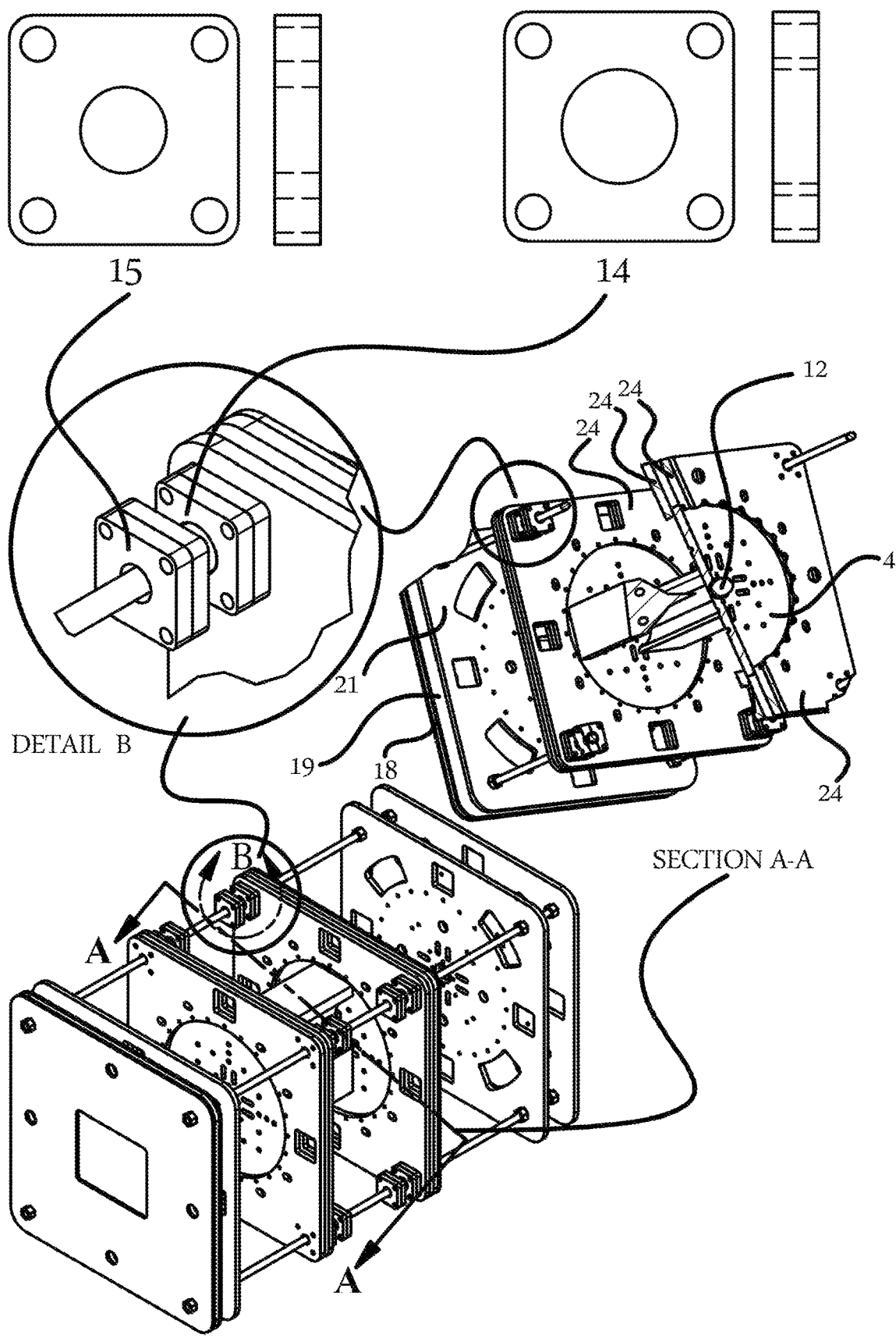
FIG. 8: Holder plates that hold the linear bearing 3.

Some linear bearings 13 used to transfer the moveable chassis on the fixed shaft and act as a holder to prevent the linear bearings vibrations, The movements in linear bearings restricted by part 15 and mounted on an electron intrinsic spin analyzer. Those holder plates by some beads 16 attached to a fixed chassis (FIG. 8, 15).

Figure 9:
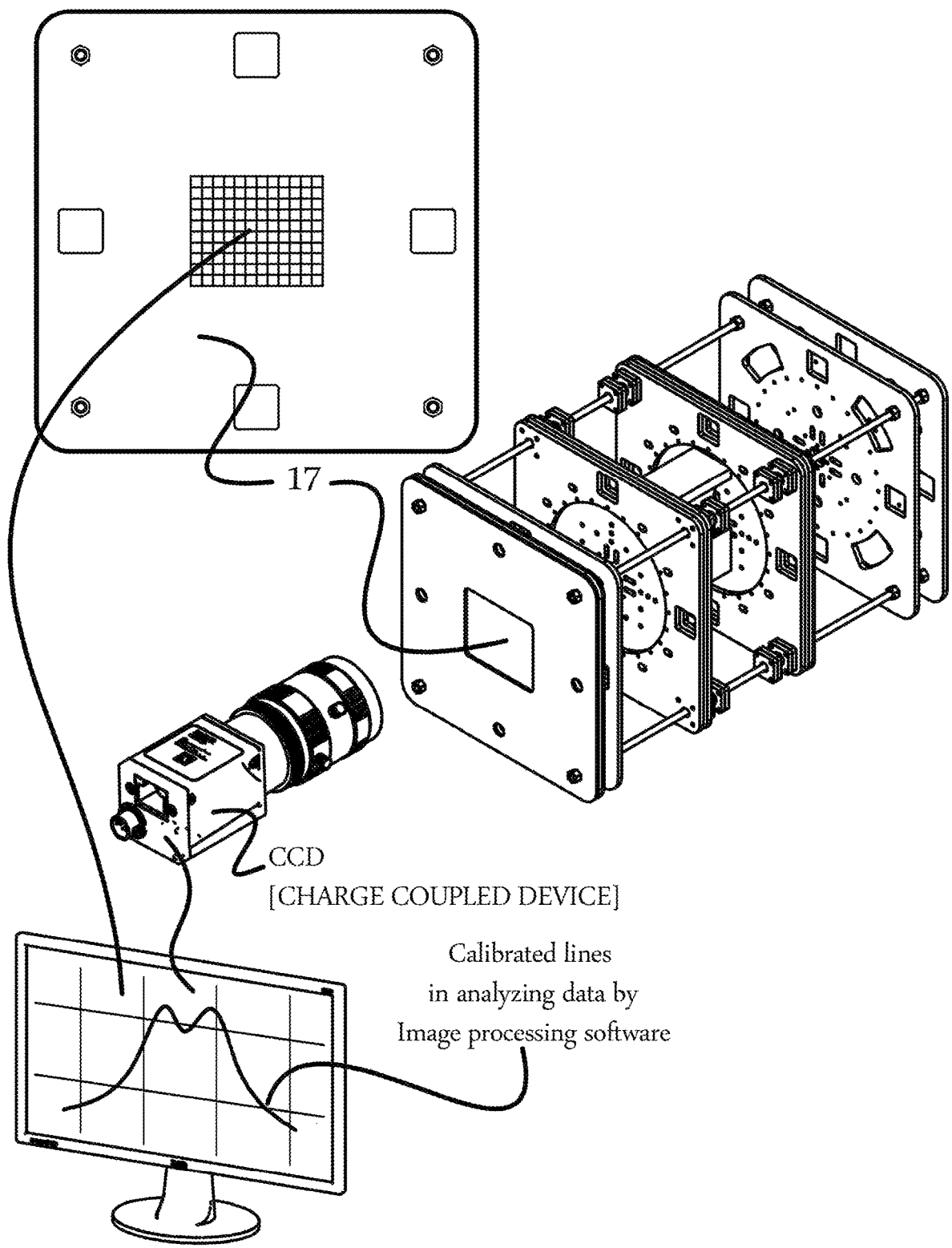
FIG. 9: Holder and calibrated plate and the role of the calibrated plate on the optical measurements in the calibration process of optical detections by CCD (charge-coupled device) that analyzed with image processing software.

The holder plate 17 characterized for calibration. A CCD (CHARGE COUPLED DEVICE) camera or a similar system takes images digitally. Additionally, it could protect the glass lamp against external damages. For this reason, some fixtures attached to this plate by two external frames placed to act as a shield. It allows the connection of LEDs for illuminating the calibrated lines, and the holder plates hole the glass lamp in a squared frame of the holder plate by other elements. There are some isolated plates for more efficient transportation. FIG. 9 indicates its structure as described above.

CCD camera or digital camera placed in the front side of the calibrated plate 17 (FIG. 9), Also for recording the experimental results of the spin separation in the free electron beam, it facilitates the analysis of the experimental data. According to the experimental observations based on the theory of the quantum, the dual flat magnets produce a homogeneous magnetic field gradient to ensure that the free-electron beam only moves according to the Lorentz force (without any spin separation in the observed beam). (FIG. 11, 12).

When a magnetic field entered on the free-electron beams, the movement of the electron beam is generally proportional to the Lorentz force that predicted from the classic physic fundamentals.

According to the fundamental notes on the theory of physics, the inhomogeneous magnetic fields cause the free electrons comprising two types of spin (quantum states) separated. The Lorentz force effect merely moves the electron beam without any spin separation. The detected image from the spin separation depends on the types of magnets used and whether it's connected to earth or no (FIG. 4).

When the body of magnets in setup II unconnected to the earth, the observed beam seems a stretched beam. The observed beam appears a single-beam in the experiment while the body of magnets connected to the earth (FIG. 12).

The reached results would lose when each body of magnets has not any electrical connection to the earth (electric neutralization). So, the passing beam of free-electrons may affect electrically and generates an unwanted weak magnetic force. It could be stretched the observed electron beam upon the presence of the produced electric current inside the glass lamp and a sharp magnet that is electrically non-neutral.

In addition, when the beam moves along the Lorentz force, the separated electrons which interacted with the inhomogeneous magnetic field rotate on the calibrated plate along the direction of the Lorentz force. So, this factor separates the spin of an electron beam in non-Lorentzian conditions. The separated electron beams appear as human eyes and mostly similar to the Stern-Gerlach classic experiments by the silver atoms (FIG. 12).

Figure 13:
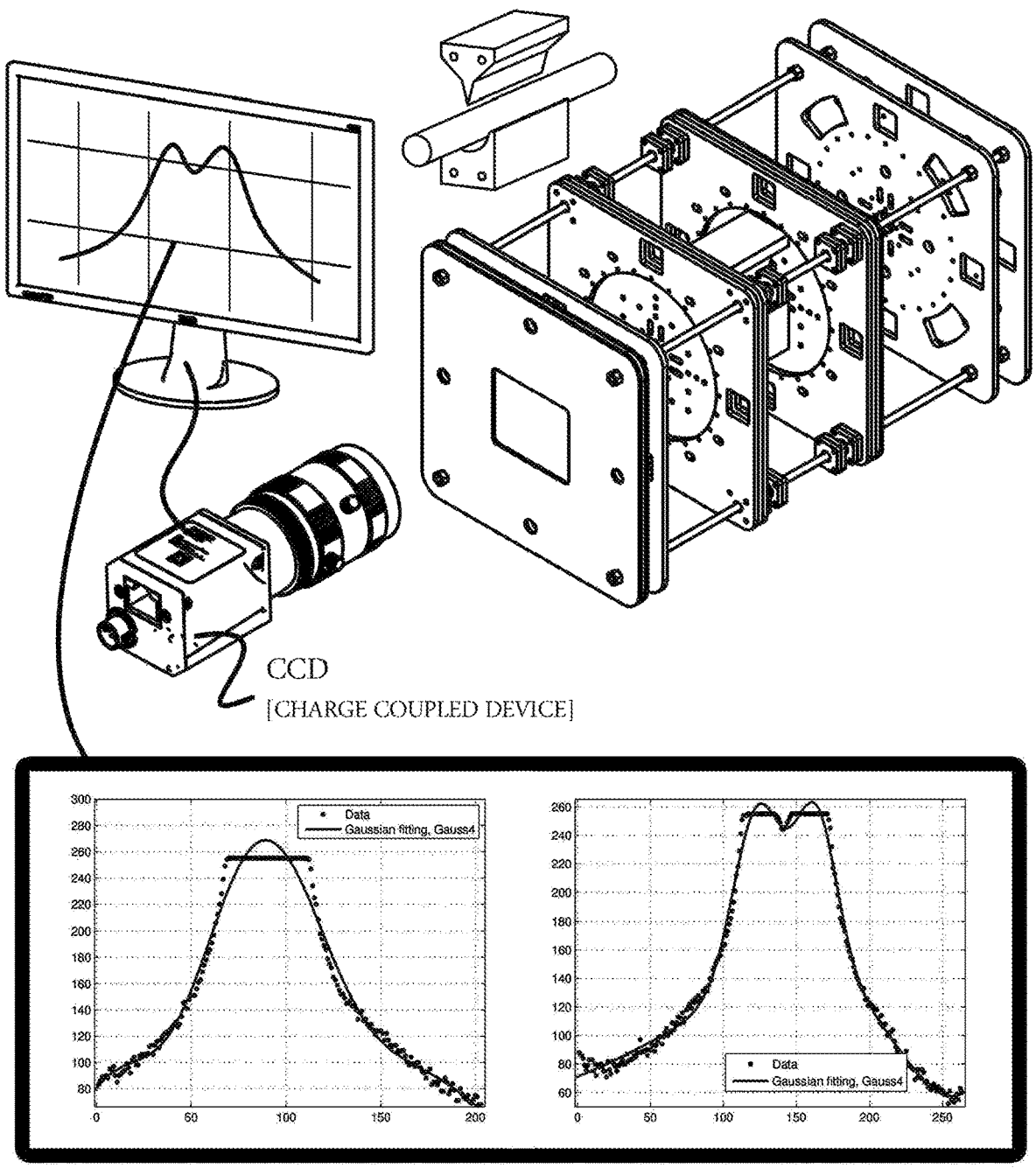
FIG. 13: Results of the experiment in setup II by using image processing software.

CCD (Charge Coupled Device) camera used to record all images when the separated free electron spin becomes visible. There is an analysis of image processing software that determined the distance of the beam's separation after the magnetic field becomes applied. The following FIG. 13 shows the fitting of the free electron beam and separation phenomena.

The holder plate 18 holding the glass lamp by components in the squared frame. The holes in this plate facilitate the movement of the movable chassis and the glass lamp. There is another holder plate 19 alike the holder plate 18. Therefore, the holder of the glass lamp in the same frame acting as a holder for other components (FIG. 14).

For making a paralleled electron beam after the separation process, another coil 20 may apply for the better observation of the electron beams. However, it does not has any principal role in the spin separating process of free electrons, and this coil may just be used for better observation of free electron spin. Therefore, it could omit by users from the assembled apparatus.

Holder plate 21 is a part of the fixed chassis. Some of the holes used to assemble the fixed chassis or magnets, when the moveable chassis unapplied for rotation. The holder plate could replace the moveable chassis. Some holes on the holder plate used to help in the transporting or installing metal parts of magnets in the holder plates. FIG. 14 shows the holder plates.

Figure 15:
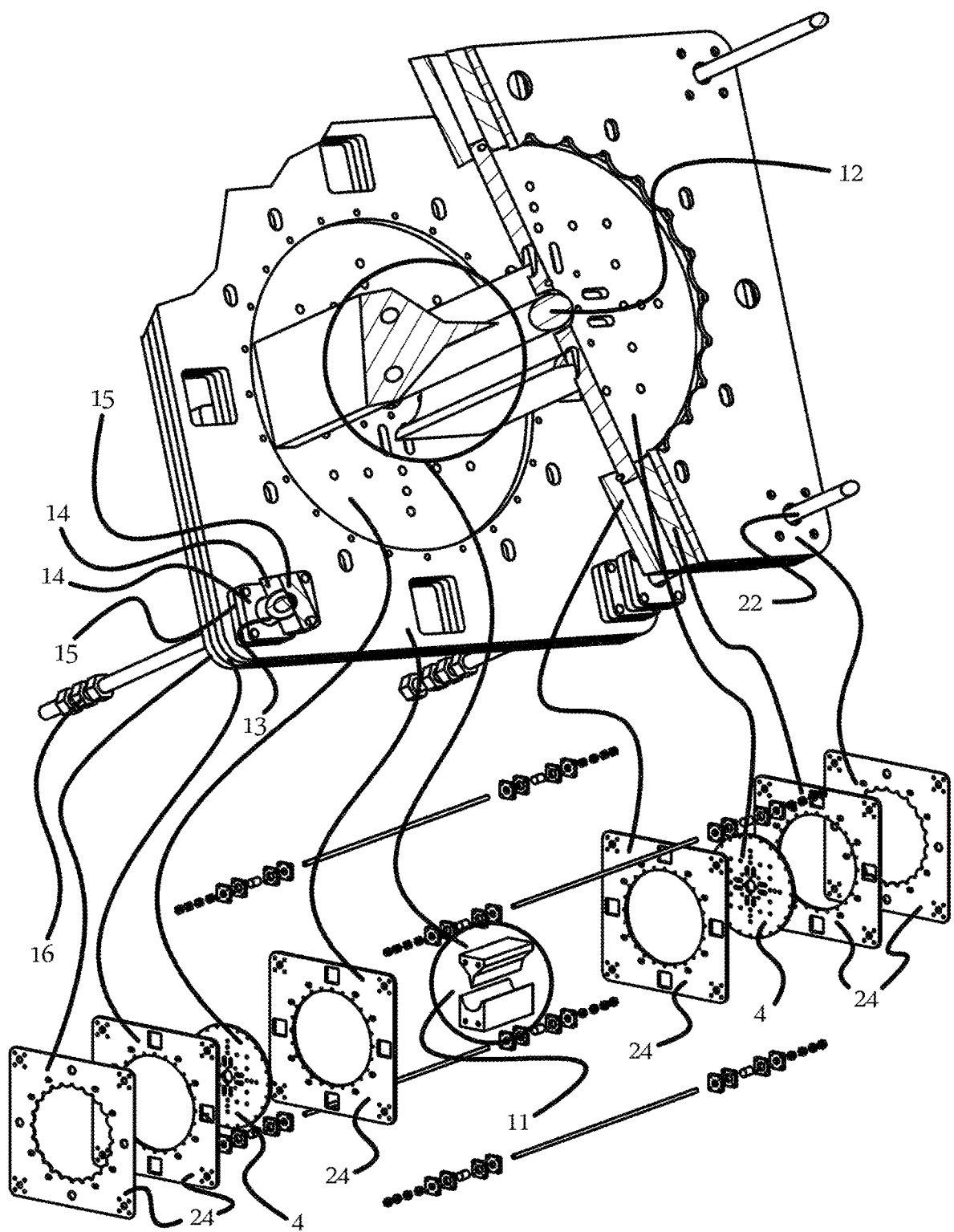
FIG. 15: Movable chassis and related parts.
Figure 16:
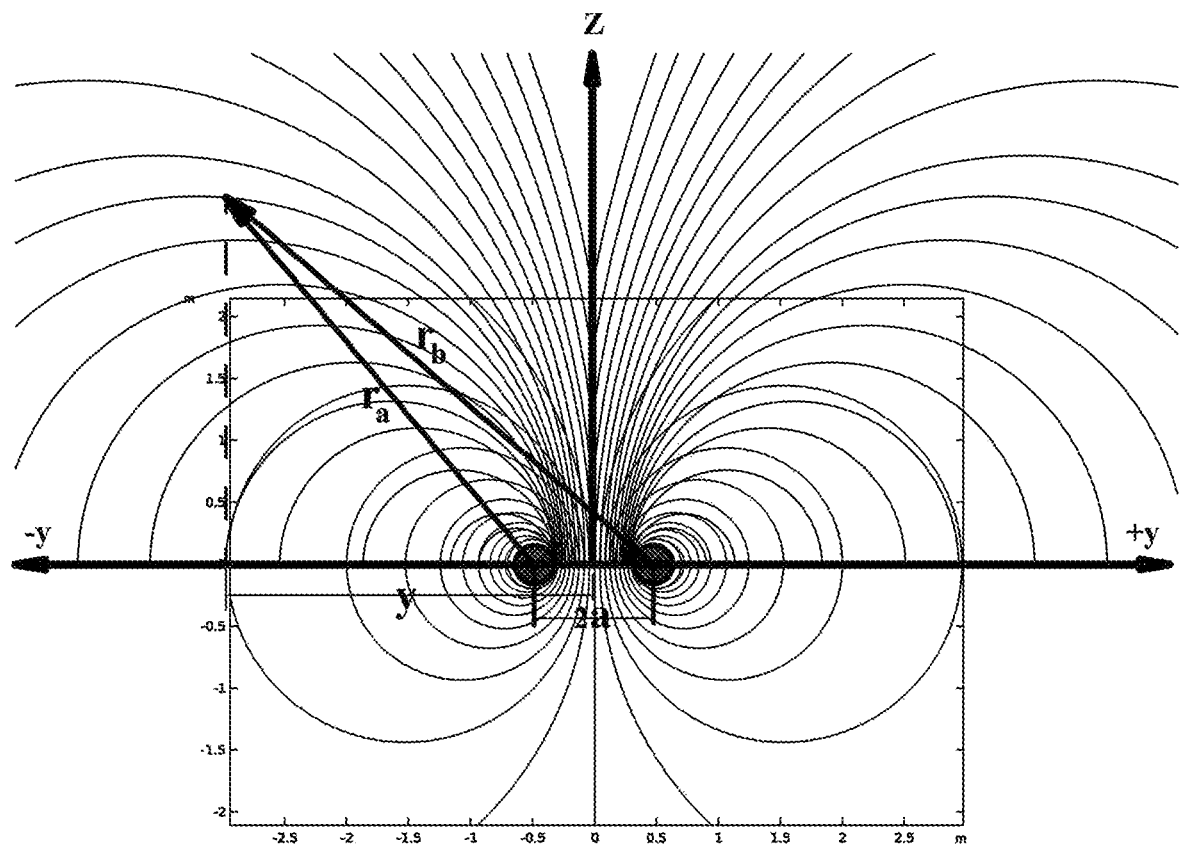
FIG. 16: A simulation of two-wire magnetic field (it helps in better understanding of inhomogeneous magnetic field which could be appearing around a sharp magnet).

The shaft 22 causes the linear bearings of the moveable chassis to move on the axes, and several parts of the device fixed by utilizing some screws at the side of the plates. The moveable part of the chassis moves on the axes. The number 23 shows a thin layer of fluorescent inside the glass lamp. The plate with the moveable part of chassis includes a significant circular hole at the center of the plate for allowing users to rotate the plate 4. The holes used to transfer the bolts, bearing, and to fix plate 4. There are some slits on this axis, contributing to its transportation, which shows in FIG. 15.

Major technical advantages of the invention:
1) This apparatus observes and measures the intrinsic-spin separation of a free-electron bean in the vacant for the first time in the free space with no atomic bounds or energy levels in semiconductors.
2) Magnets that assembled on the circular plates cause to adapt and rotate the magnet's angles.
3) There are some apertures and holes in the plates for allowing, connecting, measuring facilities as well as holding elements.
4) Several moveable chassis used simultaneously for the sequence Stern-Gerlach experiments by attaching dual inhomogeneous magnets in the chassis assembly when the axial length and tail of the glass lamp lengthened.
5) The apparatus can be easily assembled and transported.
6) The calibrated plates characterized and by greater efficiency when the image processing software used a CCD camera.
7) Based on the Lorentz force effect, the electron beam just detected as a single-pointed beam by utilizing dual flat magnets.
8) It uses stationary magnets or coils to produce a stable magnetic field gradient by a power supply.
9) Based on utilizing the physical geometrical fundamentals in this invention for reaching much more accurate in the measurement, this invention calibrates the results by image processing software and plasma properties.
10) For assembling, some plates applied to reduce the weight of the chassis.
11) That pointed plates are anti-moisture, anti-static, and movable. The utilized materials in the plates significantly reduce the risk of electric shock.
12) The utilized voltages and power supplies designed to the DC voltage and electric current could stay in a constant value.

BIBLIOGRAPHIC REFERENCES

[1]. Samuel A. Goudsmit. It might as well be spin. Physics Today, 29(6), 40-43. (1976).
[2]. Samuel A. Goudsmit, George E. Uhlenbeck. Spinning electrons and the structure of spectra. Nature, 117, 264-265. (1926).
[3]. G. E. Uhlenbeck, S. Goudsmit. Naturwissenschaften, 13 (47) 953. (1925).
[4]. Abraham Pais. George Uhlenbeck and the discovery of electron spin. Physics Today, 42(12), 34-40. (1989).
[5]. Wolfgang, Pauli. Zur Quantenmechanik des magnetischen Elektrons. Zeitschrift fur Physik, 43(9-10), 601-623. (1927).
[6]. Wolfgang, Pauli. The Connection Between Spin and Statistics. Phys. Rev. 58(8), 716-722. (1940). DOI: 10.1103/PhysRev.58.716.
[7]. Wolfgang, Pauli. Exclusion Principle and Quantum Mechanics. Nobel Lecture. Nobel Prize. (December 1946).
[8]. D. I, Blokhintsev. Intrinsic Angular Momentum and Magnetic Moment of the Electron Spin. (1964). DOI: 10.1007/978-94-010-9711-6_10.
[9]. Alberto Galindo, Carlos Sanchez Del Rio. Intrinsic magnetic moment as a nonrelativistic phenomenon. American Journal of Physics, 29(9), 582-584. (1961).
[10]. Sonja, Franke-Arnold. Orbital angular momentum of photons, atoms, and electrons. Proceedings of SPIE, 8637, 86370P. (January 1964). DOI: 10.1117/12.2002984.
[11]. Charles W. Clark, Roman Barankov, Michael G. Huber, Muhammad Arif, David G. Cory, and Dmitry A. Pushin. Controlling neutron orbital angular momentum. Nature, volume 525, 504-506. (September 2015).
[12]. Ebrahim Karimi, Vincenzo Grillo, Amir H. Tavabi, Federico Venturi, Hugo Larocque, Roberto Balboni, Gian Carlo Gazzadi, Stefano Frabboni, Peng-Han Lu, Erfan Mafakheri, Frédéric Bouchard, Rafal E. Dunin-Borkowski, Robert W. Boyd, Martin P. J. Lavery, and Miles J. Padgett. Measuring the orbital angular momentum spectrum of an electron beam. Nature Communications 8:15536. (May 2017). DOI: 10.1038/ncomms15536.
[13]. Domenico, Giulini. Electron Spin or Classically Non-Describable Two-Valuedness. Stud, Hist, Philos, Mod, Phys, 39, 557-578. (October 2007). DOI: 10.1016/j.shpsb.2008.03.005.

[14]. Alberto Galindo, Carlos Sanchez Del Rio. Intrinsic magnetic moment as a nonrelativistic phenomenon. American Journal of Physics, 29(9), 582-584. (1961).

[15]. T. E. Phipps, J. B. Taylor. The magnetic moment of the hydrogen atom. Physical Review, volume 29. (February 1927).

[16]. Carsten Henkel, Georg Jacob, Felix Stopp, Ferdinand Schmidt-Kaler, Mark Keil, Yonathan Japha, Ron Folman. Stern-Gerlach splitting of low-energy ion beams. New J. Phys, 21 (8), (July 2019). DOI: 10.1088/1367-2630/ab36c7.

[17]. Ronald L. Cappelletti, Terrence Jach, and John Vinson. Intrinsic Orbital Angular Momentum States of Neutrons. Phys. Rev. Lett. 120, 090402. (March 2018).

[18]. K. Fujikawa, R. E. Shrock. Magnetic Moment of a Massive Neutrino and Neutrino-Spin Rotation. Physical Review Letters. 45 (12), 963-966. (1980).

[19]. Paul A. M. Dirac. The quantum theory of the electron. Proceedings of the Royal Society of London, Series A, 117(778), 610-624. (1928).

[20]. O. Stern. Ein Weg zur experimentellen Pruefung der Richtungsquantelung im Magnetfeld. Zeitschrift für Physik. 7 (1), 249-253. (1921). DOI: 10.1007/BF01332793.

[21]. W. Gerlach, O. Stern. Das magnetische Moment des Silberatoms. Zeitschrift für Physik. 9 (1), 353-355. (1922). DOI: 10.1007/BF01326984.

[22]. B. Friedrich, D. Herschbach Stern and Gerlach: How a Bad Cigar Helped Reorient Atomic Physics. Physics Today. 56 (12), 53. (2003). DOI: 10.1063/1.1650229.

[23]. Niels, Bohr. Nature. London. 121, 580. (1928).

[24]. Niels, Bohr. J. Chem. Soc.134, 349. (1932).

[25]. Wolfgang, Pauli. In le Magnetisme. Proccedings of the 6th Solvay conference, Gauthier-Villars, Paris. (1932).

[26]. Wolfgang, Pauli. In Handbuch der Physik (edited by S. Flugge). Springer, Berlin. Vol. 5, Pt. 1, p. 165. (1958).

[27]. N. Mott. Proc, R, Soc. London. A 124, 425. (1929).

[28]. N. F. Mott, H. S. W. Massey. The Theory of Atomic Collisions. 3rd ed. Clarendon Press, OxFord. pp, 214-219. (1965).

[29]. Wolfgang, Pauli. Handbuch der Physik, Springer, Berlin. vol. 1, chap. Secs. 9, 12, 23. (1958).

[30]. a letter to N. F. Mott in (1929).

[31]. Niels, Bohr. Discussions with Einstein on Epistemological Problems in Atomic Physics. Marxists Internet Archive. Retrieved 2010-08-30. From Albert Einstein: Philosopher-Scientist publ. Cambridge University Press, Niels Bohr's report of conversations with Einstein. (1949).

[32]. Bohr-Einstein debates, "God does not throw dice" quote

[33]. Pierre Marage, Grégoire Wallenborn. The Debate between Einstein and Bohr, or How to Interpret Quantum Mechanics. The Solvay Councils and the Birth of Modern Physics, pp 161-174.

[34]. A, Pais. Einstein and the quantum theory. Reviews of Modern Physics 51, 863-914, p. 907. (October 1979).

[35]. M. Garraway, S. Stenholm. Phys. Rev. A 60, 63. (1999).

[36]. Einstein, P. Ehrenfest, Zeit. fur Physik, 11, 31. (1922).

[37]. Jeff Lieberman. The Stern-Gerlach Experiment. Massachusetts Institute of Technology Physics Department (MITPD). (June 1998).

[38]. Langmuir, H. Mott-Smith. The theory of collectors in gaseous discharges, Phys. Rev. 28, 727763. (1926).

[39]. J. B. Hoag, S. A. Korff. Electron and Nuclear Physics. Van Norstrand, New York. Chapter 8. (1952).

[40]. Robert, L. Merlino. Understanding Langmuir probe current-voltage characteristics. Am. J. Phys. 75 (12). (December 2007).

[41]. M. A. Liberman, j. Lichtenberg. Principles of plasma discharge and materials processing. John Wiley, sons, chapter 6. (2005).

[42]. Roth, J. Reece. Industrial plasma Engineering. Chapter 9. (1995).

[43]. A. M. Howatson. An Introduction to Gas Discharges. Pergamon Press. Oxford. (1965).

The invention claimed is:

1. An electron intrinsic spin analyzer, comprising:
   a glass lamp comprising an electronics unit, an elongated tube, and a fluorescent plate, wherein the electronics unit comprises metal grids with micrometric holes, wherein a free electron beam undergoes deionization and paralleling by passing through the micrometric holes located in the metal grids, and wherein the fluorescent plate comprises a thin fluorescent layer which is covered on both sides by graphite covers that prevent the accumulation of electrical charges in the glass lamp;
   a mechanical chassis comprising holder plates, calibrated plates and fixed shafts that holds the glass lamp and magnets, wherein the holder plates and calibrated plates are moisture resistant, anti-static and electric shock resistant, and wherein the magnets comprise either sharp-curved magnets that generate an inhomogeneous magnetic field or dual flat magnets that generate a homogeneous magnetic field by stationary magnets or coils;
   a Langmuir measurement probe that measures plasma parameters in the glass lamp, wherein the Langmuir measurement probe measures the electron velocity, electron energy, electron temperature and electron density of the free electron beam;
   LEDs to illuminate the calibrated lines;
   a DC power supply providing the power to the glass lamp, the magnets and the Langmuir measurement probe; and
   multiple beam splitters which reflect light onto a CCD (charge-coupled device) camera that displays independent quantum states of an electron.

2. The electron intrinsic spin analyzer according to claim 1, wherein the electrical unit further comprises:
   a thin tungsten wire that is connected to the power supply and produces the free electron beam;
   a ceramic collimator that focuses the free electron beam;
   the metal grids deflecting negative ions that are heavier than the electrons;
   the elongated tube which the electrons travel through;
   the mechanical chassis holding the metal grids and the electrical unit; and
   a gitter composed of cesium dioxide and barium which is connected to the metal grids that removes any remaining atoms in the elongated tube.

3. The electron intrinsic spin analyzer according to claim 2 further comprising:
   the elongated tube conducting the free electrons from the tungsten wire, wherein the width of the free electron beam is controlled by the micrometric holes on each of the metal grids.

4. The electron intrinsic spin analyzer according to claim 1 further comprising:
   the graphite covers configured to electrically and optically shield the glass lamp, wherein an inner graphite cover of the graphite covers on the inside of the fluorescent plate absorbs heavier atomic and subatomic particles, and wherein an outer graphite cover of the graphite covers on the outside of the fluorescent plate is grounded.

5. The electron intrinsic spin analyzer according to claim 1, wherein the chassis comprises:
   a fixed chassis that holds the glass lamp; and
   a moveable chassis that is configured to hold and rotate the magnets.

6. The electron intrinsic spin analyzer according to claim 1, wherein the DC power supply comprises:
   a constant DC power source with a constant current that can provide between 10 and 25,000 volts for the coils, the Langmuir measurement probe and LEDs.

7. The electron intrinsic spin analyzer according to claim 1, wherein
   the CCD camera and the Langmuir measurement probe collect data on interactions between the free electron beam and the homogeneous magnetic field or inhomogeneous magnetic field;
   the CCD camera and the Langmuir measurement probe collect data on a position, the width, an intrinsic spin force of the free electron beam according to the Lorentz force effect, and determine the independent quantum state of the electron.

* * * * *